United States Patent [19]

Hawrylo

[11] 4,182,995
[45] Jan. 8, 1980

[54] LASER DIODE WITH THERMAL CONDUCTING, CURRENT CONFINING FILM

[75] Inventor: Frank Z. Hawrylo, Trenton, N.J.

[73] Assignee: RCA Corporation, New York, N.Y.

[21] Appl. No.: 887,365

[22] Filed: Mar. 16, 1978

[51] Int. Cl.² .................................................. H01S 3/19
[52] U.S. Cl. .................................. 331/94.5 H; 357/15; 357/18
[58] Field of Search .................... 331/94.5 H, 94.5 P; 357/16, 17, 18, 81, 15

[56] References Cited

U.S. PATENT DOCUMENTS

| | | | |
|---|---|---|---|
| 3,234,057 | 2/1966 | Anderson | 357/16 X |
| 3,723,903 | 3/1973 | Paoli et al. | 331/94.5 M |
| 3,982,261 | 9/1976 | Antypas | 357/16 |

FOREIGN PATENT DOCUMENTS 2721114 11/1977 Fed. Rep. of Germany ..... 331/94.5 H

OTHER PUBLICATIONS

J. J. Hsieh, et al., "Room-Temperature CW Operation of GaInAsP/InP Double Heterostructure Diode Lasers Emitting a 1.1 μm," *App. Phys. Let.*, vol. 28, No. 12, Jun. 15, 1976, pp. 709-711.

K. Itoh et al., "New Heteroisolation Stripe-Geometry Visible-Light-Emitting Lasers," IEEE J. of Quantum Electronics, vol. QE 11, No. 7, Jul. 1975, pp. 421-426.

*Primary Examiner*—James W. Davie
*Attorney, Agent, or Firm*—H. Christoffersen; D. S. Cohen

[57] ABSTRACT

A laser diode formed of a rectangular parallelopiped body of single crystalline semiconductor material includes regions of opposite conductivity type indium phosphide extending to opposite surfaces of the body. Within the body is a PN junction at which light can be generated. A stripe of a conductive material is on the surface of the body to which the P type region extends and forms an ohmic contact with the P type region. The stripe is spaced from the side surfaces of the body and extends to the end surfaces of the body. A film of germanium is on the portions of the surface of the P type region which is not covered by the conductive stripe. The germanium film serves to conduct heat from the body and forms a blocking junction with the P type region so as to confine the current through the body, across the light generating PN junction, away from the side surfaces of the body.

5 Claims, 1 Drawing Figure

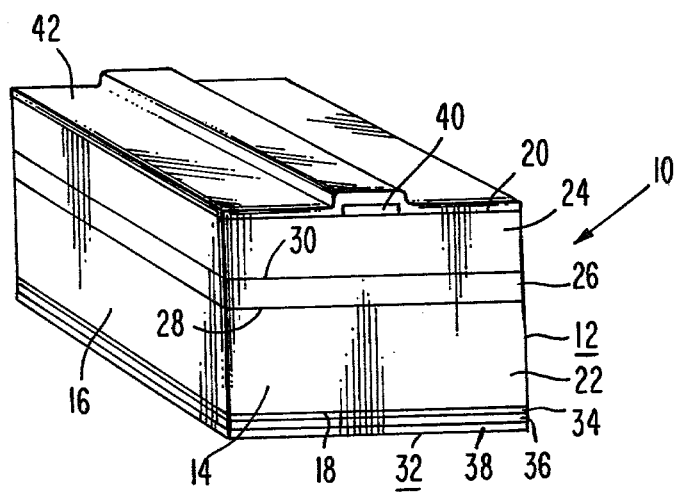

LASER DIODE WITH THERMAL CONDUCTING, CURRENT CONFINING FILM

The invention described herein was made in the performance of work under a NASA contract and is subject to the provisions of section 305 of the National Aeronautics and Space Act of 1958, Public Law 85-568 (72 Stat. 435; 42 U.S.C. 2457).

The present invention relates to a semiconductor laser diode having a stripe contact and particularly to such a laser diode which also includes a film on the surface with the stripe contact for achieving good thermal conductivity from the diode.

For improved operation of a semiconductor laser diode it has been found desirable to construct the diode so that the flow of current through the diode and across the light generating PN junction is confined in a region spaced from the sides of the diode. One technique which has been used to achieve current confinement is to form one of the contacts of the diode, generally the contact on the P type conductivity region of the diode, as a narrow stripe which is spaced from the sides of the diode. The stripe contact is generally formed by first depositing a layer of an insulating material, such as silicon oxide, on the surface of the diode. The portion of the insulating material over the area of the surface where the stripe is to be provided is then removed, such as by etching. A metal layer is then deposited on the exposed area of the diode to form the stripe contact. The metal layer may also extend over the insulating material. A semiconductor laser diode having such a structure contact is shown in U.S. Pat. No. 3,723,903 issued to T. L. Paoli et al. on Mar. 27, 1973 entitled DYNAMIC FM CONTROL OF THE TRANSVERSE MODES OF A SELF-PULSING SEMICONDUCTOR LASER.

A problem with such semiconductor laser diode having a stripe contact results from the relatively low thermal conductivity of the silicon oxide. It is desirable that the diode be maintained as cool as possible during operation. To achieve this the diode is generally mounted on a heat sink which conducts heat away from the diode. As shown in U.S. Pat. No. 3,723,903, the diode is generally mounted on the heat sink with the stripe contact engaging the heat sink since the stripe contact is generally closest to the PN junction where the heat is generated. However, since the silicon oxide insulating material is not a relatively good conductor of heat, most of the heat must be conducted to the heat sink through the narrow metal strip contact. Therefore, it would be desirable to have a material which is a good thermal conductor so as to achieve a greater conduction of heat to the heat sink, yet which will not adversely affect the current confining function of the stripe contact.

The FIGURE of the drawing is a perspective view of one form of a semiconductor laser diode embodying the present invention.

Referring to the drawing a semiconductor laser diode embodying the present invention is generally designated as 10. The laser diode 10 includes a body 12 of a single crystalline semiconductor material. The body 12 is in the form of a rectangular parallelopiped having a pair of spaced, opposed end surfaces 14, a pair of spaced, opposed side surfaces 16 extending between the spaced, opposed end surfaces 14, and a pair of spaced, opposed contact surfaces 18 and 20 extending between the end surfaces 14. The body 12 includes a first region 22 of one conductivity type, such as N type, extending along the contact surface 18; a second region 24 of the opposite conductivity type, such as P type, extending along the contact surface 20, and a third region 26 between the first and second regions 22 and 24. The third region 26 can be of either conductivity type, but is preferable of P type conductivity. The first and second regions 22, and 24 are preferably of indium phosphide (InP) and the third region 26 is of semiconductor material having a lower bandgap energy than the material of the first and second regions 22, 24. One suitable material is indium gallium arsenide phosphide (InGaAsP). Thus there are provided heterojunctions 28 and 30 between the third region 26 and each of the first and second regions 22 and 24, respectively. The junction 28 is also a PN junction for generated light.

On the contact surface 18 is a first contact 32 which covers the entire contact surface 18. The first contact 32 may be of any conductive material which forms an ohmic contact with the material of the first region 22. As an example there is shown a first contact 32 which is formed of three superimposed layers 34, 36 and 38 with the layer 34 directly on the contact surface 18 being of an alloy of 80% gold and 20% tin, and the second layer 36 being of nickel and the outermost layer 38 being of gold. On the contact surface 20 is a second contact 40 in the form of a narrow stripe extending between the end surfaces 14 and spaced from the side surfaces 16. The stripe contact 40 is of a conductive material which forms a good ohmic contact with the P type material of the second region 24. For making good ohmic contact with P type indium phosphide, an alloy of 85% gold, 13% germanium and 2% zinc is a suitable material. A film 42 of germanium is on the portions of the contact surface 20 between the stripe contact 40 and the side surfaces 16 of the body 12. As shown, the germanium film 42 may also extend over the stripe contact 40.

The semiconductor laser diode 10 may be made by starting with a substrate of N type indium phosphide, which will provide the first region 22, first growing the third region 26 on a surface of the substrate, and then growing the second region 24 of P type indium phosphide on the third region 26. The second and third regions 24 and 26 may be grown by either of the well known techniques of vapor phase epitaxy or liquid phase epitaxy. The various layers of the first contact 32 may be provided by the well known technique of evaporation in a vacuum of the particular materials. The stripe contact 40 may be formed by first depositing a layer of silicon oxide on the contact surface 20, applying a layer of a photoresist on the silicon oxide layer, except where the stripe contact should be provided, using standard photolithographic techniques, removing the uncovered portion of the silicon oxide layer with a suitable etchant, such as buffered HF, and then depositing the material of the stripe contact 40 by evaporation in a vacuum. The silicon oxide layer is then removed with a suitable etchant and the germanium film 42 is then deposited on the contact surfaces and stripe contact 40 by evaporation in a vacuum In the use of the semiconductor laser diode 10, the laser diode is mounted on a heat sink with the stripe contact 40 and germanium film 42 contacting the heat sink. Since germanium is a good conductor of heat, the heat generated in the laser diode 10 will be conducted therefrom to the heat sink both through the germanium film 42 and the stripe contact 40. Thus, there will be a better removal of heat from the semiconductor laser diode 10 than from a similar laser diode using a silicon oxide layer on each side of the stripe contact. The germanium film 42 forms a blocking contact with the surface of the P type indium phosphide second region 24 so that the current passing through the laser diode 10 will still only flow from the stripe contact 40. Thus the confinement of the current away from the side surface 16 of the laser diode 10 is maintained.

Thus, the germanium film 42 provides a greater conduction of heat from the diode 10 then is provided by silicon dioxide without adversely affecting the current confinement.

I claim:

1. A semiconductor laser diode comprising:
 a body of single crystalline semiconductor material having opposed end surfaces, opposed side surfaces extending between said end surfaces and opposed contact surfaces extending between said end surfaces, said body having therein regions of opposite conductivity types forming a PN junction therebetween, said PN junction extending between said end surfaces and each of said regions extending to a separate one of said contact surface with at least a portion of each of said regions which extends to said contact surface being of indium phosphide,
 a first conductive layer on one of said contact surfaces and forming an ohmic contact with the semiconductor body,
 a second conductive layer on the other of said contact surface and forming an ohmic contact with the semiconductor body, said second conductive layer being in the form of a stripe extending between said end surfaces and spaced from the side surfaces, and
 a film of germanium on the portions of the other contact surface between the second conductive layer and the side surfaces, said germanium film forming a blocking contact with the indium phosphide portions of the semiconductor body.

2. A semiconductor laser diode in accordance with claim 1 in which the second conductive layer and the germanium film are on the region of P type conductivity of the semiconductor body.

3. A semiconductor laser diode in accordance with claim 2 in which the semiconductor body includes three superimposed regions, one of the outer regions being of P type conductivity, the other outer region being of N type conductivity, and the intermediate region being of either N or P type conductivity type and of a material having a lower band gap energy than the outer regions.

4. A semiconductor laser diode in accordance with claim 3 in which the third region is of indium gallium arsenide phosphide.

5. A semiconductor laser diode in accordance with claim 1 in which the germanium film also extends over the second conductive layer.

* * * * *